United States Patent
Arimoto

(10) Patent No.: US 7,934,178 B2
(45) Date of Patent: Apr. 26, 2011

(54) LAYOUT METHOD OF SEMICONDUCTOR CIRCUIT, PROGRAM AND DESIGN SUPPORT SYSTEM

(75) Inventor: Hiroshi Arimoto, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 623 days.

(21) Appl. No.: 11/934,971

(22) Filed: Nov. 5, 2007

(65) Prior Publication Data

US 2008/0109767 A1    May 8, 2008

(30) Foreign Application Priority Data

Nov. 6, 2006  (JP) ................. 2006-300507

(51) Int. Cl.
G06F 17/50    (2006.01)
(52) U.S. Cl. ...................................... 716/100
(58) Field of Classification Search ............ 716/1, 2, 716/100
See application file for complete search history.

(56) References Cited

U.S. PATENT DOCUMENTS

| | | |
|---|---|---|
| 6,169,968 B1 | 1/2001 | Kabuo |
| 6,425,111 B1* | 7/2002 | del Mar Hershenson ......... 716/4 |
| 7,047,505 B2 | 5/2006 | Saxena et al. |
| 2004/0044511 A1 | 3/2004 | Sekido et al. |
| 2006/0142987 A1 | 6/2006 | Ishizu et al. |
| 2007/0106966 A1* | 5/2007 | Inoue et al. ....................... 716/4 |

FOREIGN PATENT DOCUMENTS

| | | |
|---|---|---|
| JP | 11-085839 A | 3/1999 |
| JP | 2004-086546 A | 3/2004 |
| JP | 2006178907 A | 7/2006 |

OTHER PUBLICATIONS

Japanese Notification of Reasons for Rejection, English-language translation, mailed Dec. 21, 2010 for corresponding Japanese Application No. 2006-300507.
Fujita, Tomohiro "Statistical Timing Analysis Method for Large Scale Integrated Circuit", DA Symposium 2000, Information Processing Society of Japan, vol. 2000, No. 8, Jul. 17, 2000, pp. 91-96.

* cited by examiner

Primary Examiner — Jack Chiang
Assistant Examiner — Suchin Parihar
(74) Attorney, Agent, or Firm — Fujitsu Patent Center

(57) ABSTRACT

A method of a layout a semiconductor circuit has obtaining transistor characteristic information on the basis of layout information about regions formed with transistors, obtaining a polynomial expression representing a relationship between characteristic values of a circuit including of the transistors and the transistor characteristic information, calculating a plurality of characteristic values corresponding to plural sets of transistor characteristic information by use of the polynomial expression, selecting part of the plurality of characteristic values on the basis of a restriction about the characteristic values, the layout information or the transistor characteristic information; and obtaining the transistor characteristic information or the layout information corresponding to the selected characteristic values.

20 Claims, 12 Drawing Sheets

FIG. 4

| DESIGN GATE LENGTH | REAL-VALUED GATE LENGTH | DESIGN GATE WIDTH | REAL-VALUED GATE WIDTH | STANDARD THRESHOLD VALUE | REAL-VALUED THRESHOLD VALUE | STANDARD MOBILITY | REAL-VALUED MOBILITY | GATE PITCH | SB | SBOF | SBE |
|---|---|---|---|---|---|---|---|---|---|---|---|
| | | | | | | | | | | | |
| | | | | | | | | | | | |
| | | | | | | | | | | | |
| | | | | | | | | | | | |

FIG. 5

| TRANSISTOR 1 | | TRANSISTOR 2 | | ... | TRANSISTOR n | | CIRCUIT DELAY | POWER CONSUMPTION | |
|---|---|---|---|---|---|---|---|---|---|
| GATE LENGTH 1 | GATE WIDTH 1 | GATE LENGTH 2 | GATE WIDTH 2 | | GATE LENGTH n | GATE WIDTH n | | | |
| | | | | | | | | | |
| | | | | | | | | | |
| | | | | | | | | | |

FIG.6B

| INPUT 1A | INPUT 1B | OUTPUT |
|---|---|---|
| 0 | 0 | 0 |
| 0 | 1 | 0 |
| 1 | 0 | 0 |
| 1 | 1 | 1 |

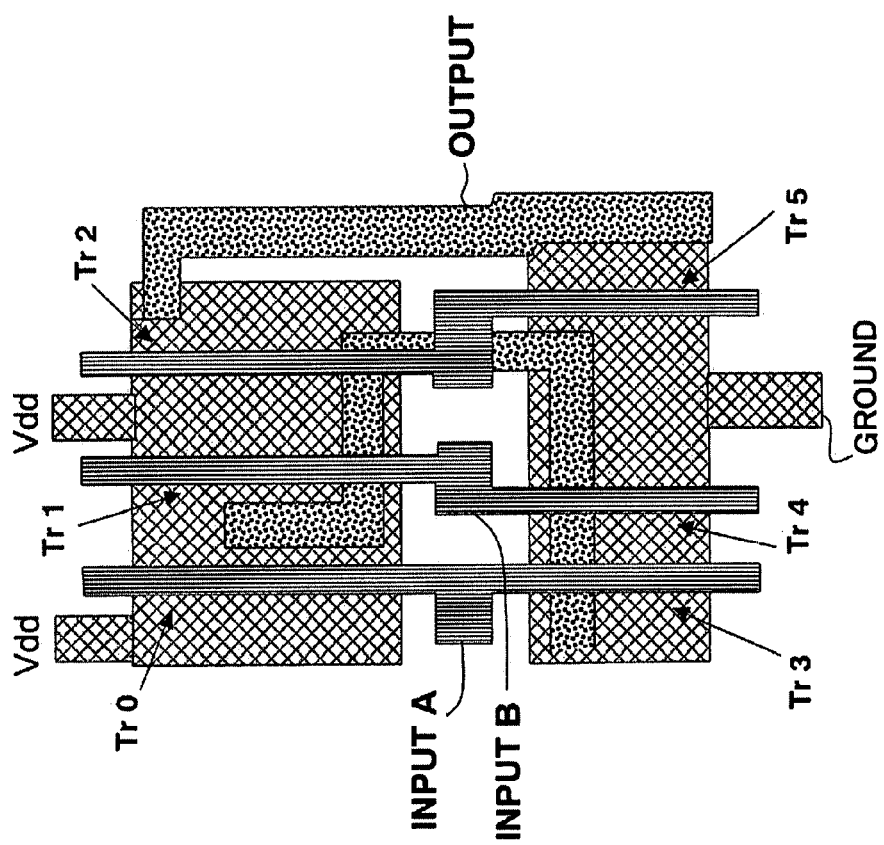

LAYOUT METHOD OF SEMICONDUCTOR CIRCUIT, PROGRAM AND DESIGN SUPPORT SYSTEM

BACKGROUND OF THE INVENTION

The present invention relates generally to a design of a semiconductor circuit, and more particularly to a technology of designing the semiconductor circuit, especially designing a circuit layout.

As micronization of LSI has advanced over the recent years, circuit characteristics have been greatly affected by accuracy of physical quantities of a shape of layout pattern, arranging positions, etc of circuit devices(circuit elements) or by variations in these physical quantities in a manufacturing process. Further, such a method was also proposed that the circuit characteristics are optimized by taking the affection thereof into prediction of the circuit characteristics.

A conventional technology is not, however, sufficient in terms of optimizing the circuit characteristics of a design target circuit as a whole including a multiplicity of devices and wirings due to a heavy load of calculation quantity. For example, the circuit design arranges a layout of a gate, a gate dimension, a gate width, etc in a way that takes a balance between a current driving force of each transistor and the load into consideration. A technology of determining the optimum gate dimension and gate width in the design target circuit as a whole, is not yet actualized.

Further, in the recent transistor, there exists a case in which the current driving force differs in the transistors having the same gate width and the same gate length, depending on a variation of device isolation patterns due to affection by a stress of a device isolation oxide film. The balance between the current driving force and the load in the actual circuit, which was taken into consideration when making the layout, might be lost. Moreover, an analysis taking a plurality of circuit characteristics simultaneously into consideration, for example, a scheme of properly determining the gate length of each of the transistors of the circuit on the basis of a trade-off relationship between power consumption and circuit delay time, is not yet provided.

SUMMARY

A method of a layout a semiconductor circuit has obtaining transistor characteristic information on the basis of layout information about regions formed with transistors, obtaining a polynomial expression representing a relationship between characteristic values of a circuit including of the transistors and the transistor characteristic information, calculating a plurality of characteristic values corresponding to plural sets of transistor characteristic information by use of the polynomial expression, selecting part of the plurality of characteristic values on the basis of a restriction about the characteristic values, the layout information or the transistor characteristic information; and obtaining the transistor characteristic information or the layout information corresponding to the selected characteristic values.

BRIEF DESCRIPTION OF THE DRAWINGS

FIG. 4 is an example of the process sensitivity table;

FIG. 5 is an example of a table stored with combinations of variable values and characteristic values;

FIG. 6B is combinations of input/output values in the 2-input AND circuit;

FIG. 6C is an example of a layout of the 2-input AND circuit;

DETAILED DESCRIPTION

<General Explanation>

The prior technologies have not enough consideration (contrivance) for optimizing the actual circuit including the multiplicity of devices. Further, in the case of determining physical quantities of respective transistors of a circuit, there is not conducted enough analysis sufficiently taking into consideration of the relationship between plural circuit characteristics, e.g., trade-off relationship between power consumption and circuit delay time.

It is an object of the description to illustrate a technology that can be applied to a design of the semiconductor circuit including multiplicity of devices.

Then, according to the technology, transistor characteristic information or layout information corresponding to characteristic values which are selected according to the technology is obtained. Further, in semiconductor circuit described by polynomial expression according to the technology, characteristics falling within a range restricted by a desired restriction can be efficiently obtained. Then, it is possible to acquire a layout of the semiconductor circuit that is specified by the variable values matching with these characteristics. Further, the layout of the semiconductor circuit that matches with the desired circuit characteristics is acquired and an optimized circuit is manufactured.

A design support tool according to a best mode (which will hereinafter be referred to as an embodiment) for carrying out the present invention will hereinafter be described with reference to the drawings. A configuration in the following embodiment is an exemplification, and the present invention is not limited to the configuration in the embodiment.

(1) Analysis of Circuit Characteristic by Circuit Simulation (SPICE: Simulation Program Integrated Circuits Especially)

Figure 3:
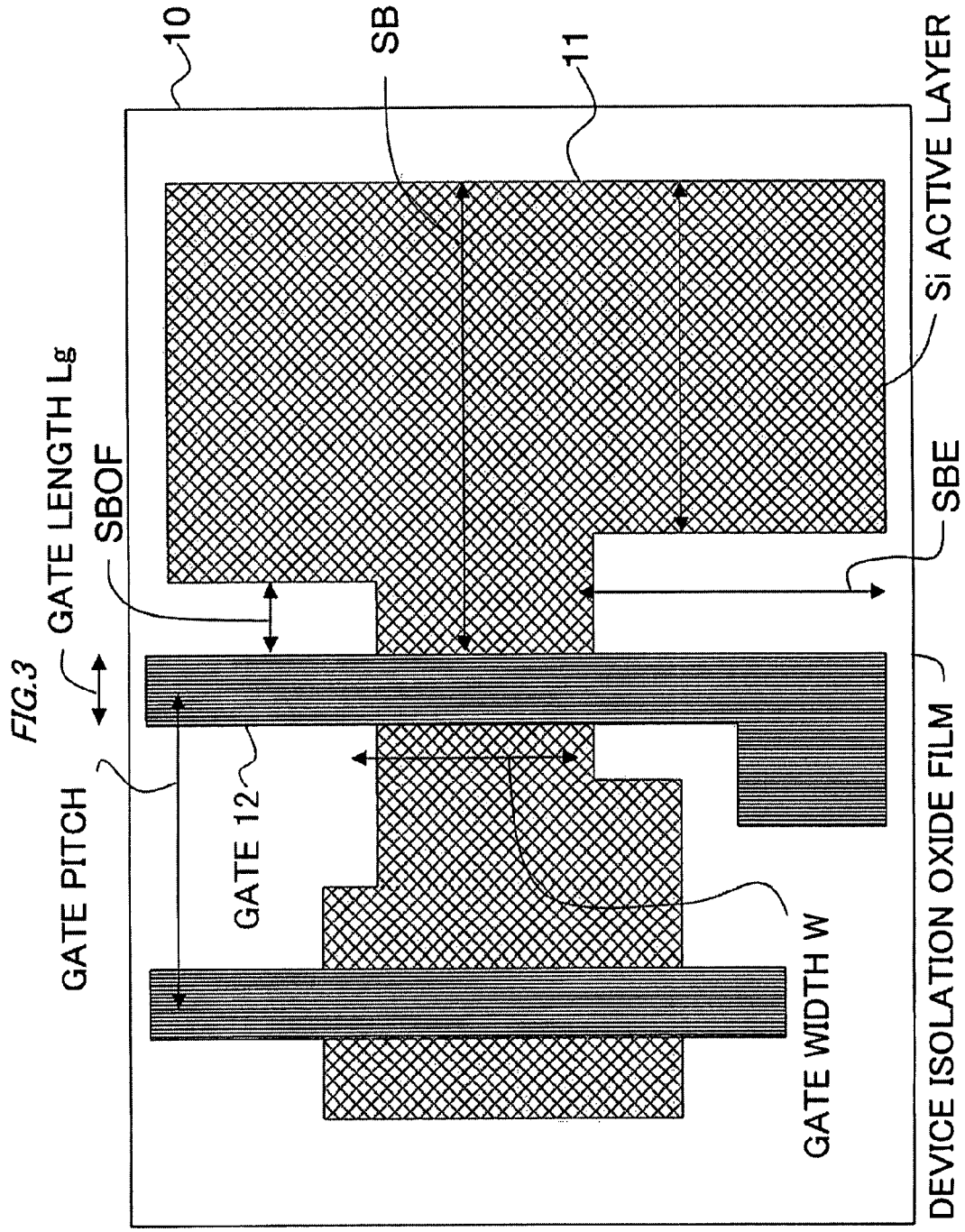
FIG. 3 is a diagram showing an example of peripheral layout information used in a process sensitivity table.

In recent transistors, such a case exists that a mobility of a carrier changes due to influence by a stress of a device isolation oxide film, and current driving force in a transistor having the same gate width and the sale gate length differs depending on a pattern variation of the device isolation oxide film as shown in FIG. 3. Generated accordingly is, for example, as illustrated in FIG. 4, a table that includes physical quantities of a real-valued gate length, a variation of the real-valued gate length, a real-valued gate width, a variation of the real-valued gate width, a real-valued threshold voltage (Vth) of the transistor, a variation of the real-valued threshold voltage, a mobility (μ), etc, which previously take account of process variations occurred in a manufacturing process, on the basis of layout information such as the device isolation pattern variation and a pitch from a neighboring gate in addition to a design gate length and a design gate width of the transistor.

Then, the real-valued gate length, the variation of the real-valued gate length, the real-valued gate width and the variation of the real-valued gate width of the transistor, the real-valued threshold voltage and the variation of the real-valued threshold voltage of the transistor and the real-valued mobility (μ) of the transistor, are referred to based on the peripheral layout information (design values) of each of the transistors in a design target circuit. Subsequently, a circuit simulation (SPICE) is implemented by use of these items of information, thereby calculating circuit characteristics.

Generated further is a plurality of circuits corresponding to combinations of the real-valued gate lengths and the real-valued gate widths of the respective transistors, the real-valued threshold voltages of the transistors, and the real-valued mobility of the transistors, and similarly calculated are the circuit characteristics such as circuit delay time and power consumption. In the present embodiment, such a combination of the physical quantities of each transistor is referred to as a level. At this time, the simulations about the combinations of all of the numerical values are not necessarily implemented, and it may be sufficient that a plurality of circuits sampled based on a Design Of Experiments (DOE) is simulated.

Figure 6A:
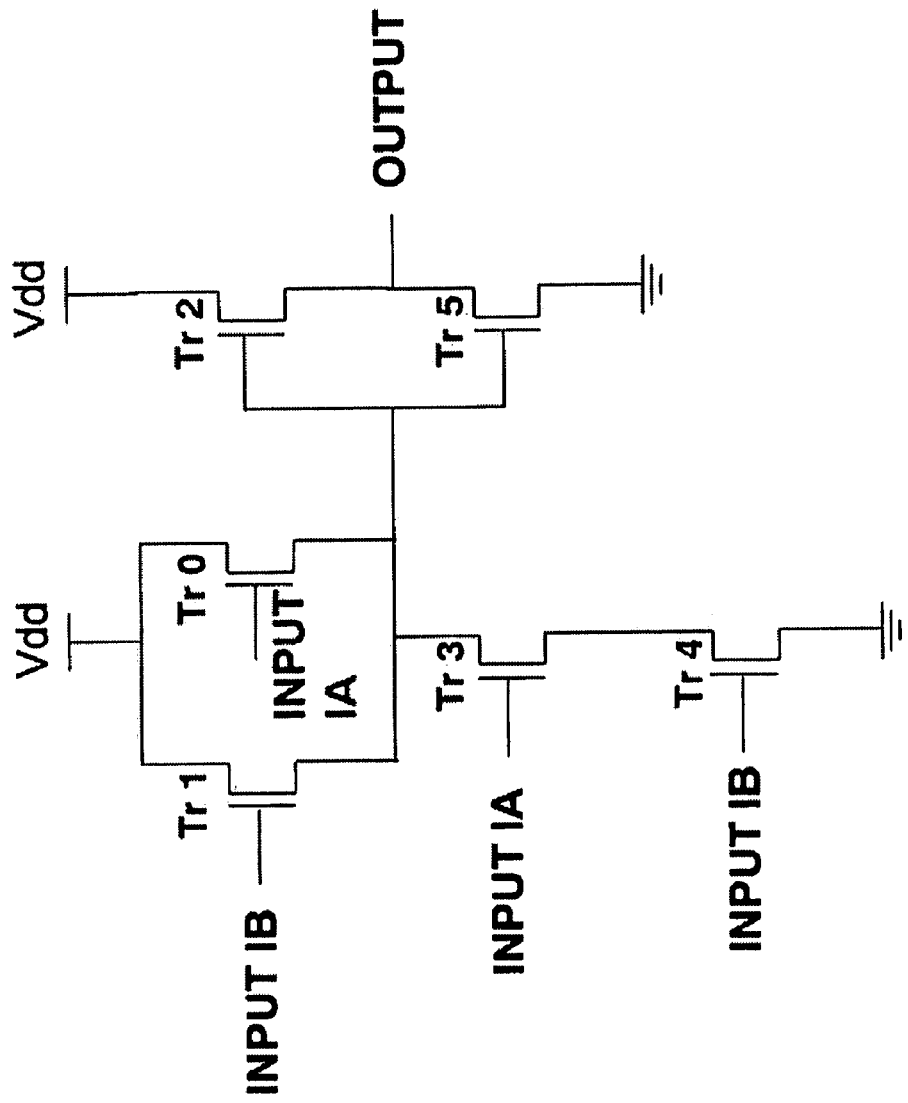
FIG. 6A is an example of a 2-input AND circuit.

Moreover, for instance, as shown in FIG. 6A, a 2-input AND circuit including a plurality of inputs has six cases such as a signal delay case in which inputs IA, IB simultaneously transit to "1" from "0", a signal delay case in which the inputs IA, IB simultaneously transit to "0" from "1", a case in which the input IA remains to be "1" while the input 1B transits to "1" from "0", a case in which the input IA remains to be "1" while the input 1B transits to "0" from "1", a case in which the input 1B remains to be "1" while the input IA transits to "1" from "0", and a case in which the input 1B remains to be "1" while the input IA transits to "0" from "1".

Figure 6B:
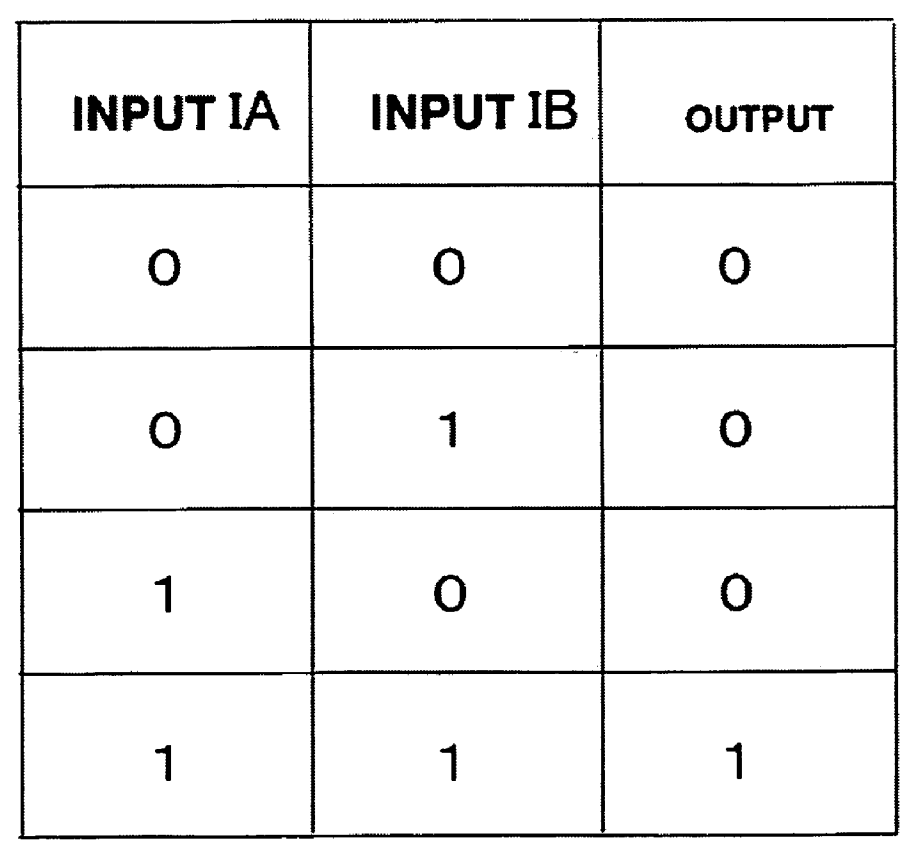

Further, a static input state, which determines the standby power consumption, takes four cases as shown in FIG. 6B. To be specific, these cases are those in which the inputs IA, IB are respectively fixed to "0" or "1". Note that a leak current can be obtained in the input state for acquiring the standby power consumption. Moreover, the power consumption when in operation represents power consumption generated when the input is switched over. For instance, this represents the power consumption equivalent to a through current (direct tunneling current) of a CMOS (Complementary Metal-Oxide Semiconductor) circuit. In these cases, the circuit simulation (SPICE) is implemented. It is to be noted that the circuit simulation may also be implemented about all of the combinations of the inputs IA, IB described above. Moreover, the circuit simulation may also be implemented in the way of being limited to some combinations of the inputs IA, IB. For example, in the case of obtaining the leak current and the standby current, it may not cause any inconvenience to limit the combinations to the four patterns in FIG. 6B. Total power consumption including the power consumption when in operation and the standby power consumption may also be set as a circuit characteristic.

(2) Determination of Polynomial Expression (Multi Regression Analysis)

A multi regression analysis is conducted based on the results of the circuit simulations, wherein variables are such items of layout data as the real-valued gate length and the real-valued gate width of each transistor, the real-valued threshold voltage of the transistor and the real-valued mobility of the transistor, a pattern layout, the variations in the manufacturing process and the transistor characteristics based thereon, and response variables are the circuit characteristics such as the circuit delay time, the power consumption and the leak current or the variations of the circuit characteristics (which will hereinafter be termed variation characteristics).

Herein, the variations in the manufacturing process represent, for example, a variation of the gate width, a variation of the gate length, a variation of gate oxide film thickness due to a heat treatment temperature, a variation of a side wall width and a variation of an STI (Shallow Trench Isolation) step, which are derived from the variations in the manufacturing process, and also connote parameters that can be monitored in the manufacturing process. These parameters or variations of the parameters are monitored, and a relationship with the circuit characteristics or a relationship with the variation characteristics of the circuit characteristics may undergo the multi regression analysis. The characteristics of the delay time, the power consumption and the leak current of the specified circuit are thereby approximated by the polynomial expression, wherein the variables are the real-valued gate length and the real-valued gate width of each transistor, the real-valued threshold voltage of the transistor and the real-valued mobility of the transistor.

In the 2-input AND circuit, for example, when the input IA is "1" while the input IB transits (rises) to "1" from "0" or transits (falls) to "0" from "1", the delay time can be expressed by the following polynomial expressions using a real-valued gate length $Lg_i$ ($i=0, \ldots, 5$) and a real-valued gate width $W_i$ ($i=0, \ldots, 5$) of each transistor. Herein, $A_i$ ($i=0, \ldots, 5$) and $B_i$ ($i=0, \ldots, 5$) are coefficients of the polynomial expression.

$$\text{Delay time (rise)} = \\ A + A0Lg0 + A1W0 + A2Lg0W0 + A3Lg1 + A4W1 + \\ A5Lg1W1 + A6Lg2 + A7W2 + A8Lg2W2 + A9Lg3 + \\ A10W3 + A11Lg3W3 + A12Lg4 + A13W4 + \\ A14lG4W4 + A15Lg5 + A16W5 + A17Lg5W; \quad \text{(Expression 1)}$$

$$\text{Delay time (fall)} = \\ B + B0Lg0 + B1W0 + B2Lg0W0 + B3Lg1 + B4W1 + \\ B5Lg1W1 + B6Lg2 + B7W2 + B8Lg2W2 + B9Lg3 + \\ B10W3 + B11Lg3W3 + B12Lg4 + B13W4 + \\ B14Lg4W4 + B15Lg5 + B16W5 + B17Lg5W5; \quad \text{(Expression 2)}$$

Similarly, the standby power consumption can be expressed by the polynomial expression on the basis of results of the simulations in a case where both of the inputs IA and IB are, e.g., "0" or "1".

(3) Calculation of Characteristics by Polynomial Expression

Next, characteristics of a semiconductor integrated circuit are calculated by an approximation formula of the polynomial expression acquired from the multi regression analysis. Namely, variable values in the polynomial expression are set based on the combination of the layouts. The variable values in the polynomial expression are a real-valued gate length, a real-valued gate width, etc into which a combination of a design gate length, a design gate width, etc obtained from the layout information is converted by use of a process sensitivity table.

Then, the characteristic values of the semiconductor integrated circuit are acquired as the values in the polynomial expression by inputting the variable values. In this process, the real-valued gate length or the real-valued gate width or both of the real-valued gate length and width are acquired by employing all of the combinations of the numerical values based on the plurality of levels to solve the approximation formula of the polynomial expression generated beforehand. Herein, the levels represent the combinations of the input values and can be exemplified by three levels, which are high, intermediate and low levels. The three levels can provide 3N-combinations with respect to N-pieces of variables.

Then, results thereof are organized into a table as shown in FIG. 5. In the case of combining the real-valued gate length or the real-valued gate width or both of the real-valued gate length and width on the basis of the plurality of levels with respect to all of the transistors, a tremendous number of combinations occur, and, as a matter of fact, these combinations can not be solved by the normal circuit simulations. The combinations, however, can be herein solved because these are obtained by simply calculating the approximation formula of the polynomial expression.

Then, part of the table is subjected to screening based on a plurality of restrictions. This process involves conducting the screening of the table containing the circuit delay time and the power consumption with respect to all of the combinations in a way that sets, e.g., a design rule, a device area, an area of the whole chip or a maximum gate width. Alternatively, the screening is performed by use of the circuit delay time and the power consumption as indexes. Herein, the screening connotes selecting the combinations that meets the restrictions while excluding the combinations that do not meet the restrictions.

(4) Efficiency of Arithmetic Operation

The design support tool in the present embodiment sets the combination of variables, each combination having plural levels, wherein the variable values are the physical quantities of the real-valued gate lengths or the real-valued gates width etc. Then, the design support tool calculates the delay time and the power consumption by the approximation formula of the polynomial expression generated earlier while using the combinations of those values. In that case, the design support tool executes the calculation in the polynomial expression sequentially with the variable values corresponding to the layout. At this time, the design support tool calculates the characteristic values with respect to the respective combinations of variables in the sequence from the first term of the polynomial expression and terminates, at a stage (e.g., the n-th variable calculation) where the calculated result reaches a certain limiting value (restriction), the further calculations of variables of the current combination (from the (n+1)th calculation onward).

If the delay time exceeds the target delay time at a stage of performing the calculations up to, for instance, $A+ALg0+A1W0+A2Lg0W0+A3Lg1+A4W1+A5Lg1W1+$, there are conducted none of the calculations of the subsequent combinations, i.e., the combinations such as $A6Lg2+A7W2+A8Lg2W2+A9Lg3+A10W3+A11Lg3W3+A12Lg4+A13W4+A14Lg4W4+A15Lg5+A16W5+A17Lg5W$.

Moreover, there may be previously calculated minimum values or maximum values about the terms (the n-th term, the (n+1)th term, . . . , the term of the ending variable) of the corresponding variables (subsequent to the n-th variable) in the polynomial expression. Then, the design support tool, in the case of calculating the characteristics in the sequence from the first term of the polynomial expression based on the combinations of the variable values, makes the following determination when finishing the calculations from the first term up to the (n-1)the term. To be specific, the design support tool, instead of performing the individual calculation about each of the terms from the n-th term onward, sets a maximum value or a minimum value of the values obtained by adding the terms from the n-th term onward as a value of the polynomial expression. Namely, the design support tool executes the calculations of the polynomial expression from the first term up to the (n-1)th term, and performs the calculations from the n-th term onward while adding the maximum value or the minimum value, thus omitting the actual calculations of the polynomial expression. The design support tool finishes the calculations based on the combinations of the variable values at a stage that the calculation value by the omitted calculation reaches a certain limiting value (restriction). Then, the design support tool starts the calculations of the polynomial expression based on the next combinations of the values. Such a process enables the design support tool to reduce the number of calculations to a great degree.

Further, when the limiting value is set larger or smaller than a target value, there might be a case in which a numerical value of the solution becomes "0" (a case of having none of the combinations of the variables that meet the condition). In this case, the limiting value is relaxed by a predetermined value, and again the characteristic value selecting process is executed and repeated till the numerical value of the solution becomes equal to or greater than "1". When the numerical value of the solution becomes equal to or greater than "1" and if this numerical value reaches a tremendous value in excess of a range, for example, "10" through about "100", the design support tool terminates the calculations using the polynomial expression, and repeatedly changes the set value by a predetermined value in a direction opposite to the calculations of the last time (in such a direction as to get the limiting value stricter). The number of combinations, which is approximate to an optimal value, can be acquired by conducting this repetitive change.

Embodiment

The design support tool according to an embodiment will be described with reference to the drawings in FIGS. 1 through 8. The design support tool is actualized as one function of a CAD (Computer Aided Design) system for designing an LSI (Large Scale Integration). The CAD system assumed herein is actualized on a general type of computer. The computer includes, e.g., a CPU, a memory, external storage units (such as a hard disk and a drive for a demountable portable recording medium), an interface with the external storage units, a communication interface, a display unit, and input/output units (for instance, a keyboard, a pointing device such as a mouse, etc).

The design support tool is actualized by a computer program executed on such a computer. The computer program is installed into the hard disk via the communication interface or the drive for the demountable portable recording medium. The CPU loads the installed computer program into the memory and then executes the program. Functions of the design support tool are thereby actualized. Further, the computer provides the functions of the design support tool, thereby executing a layout method.

Figure 1:
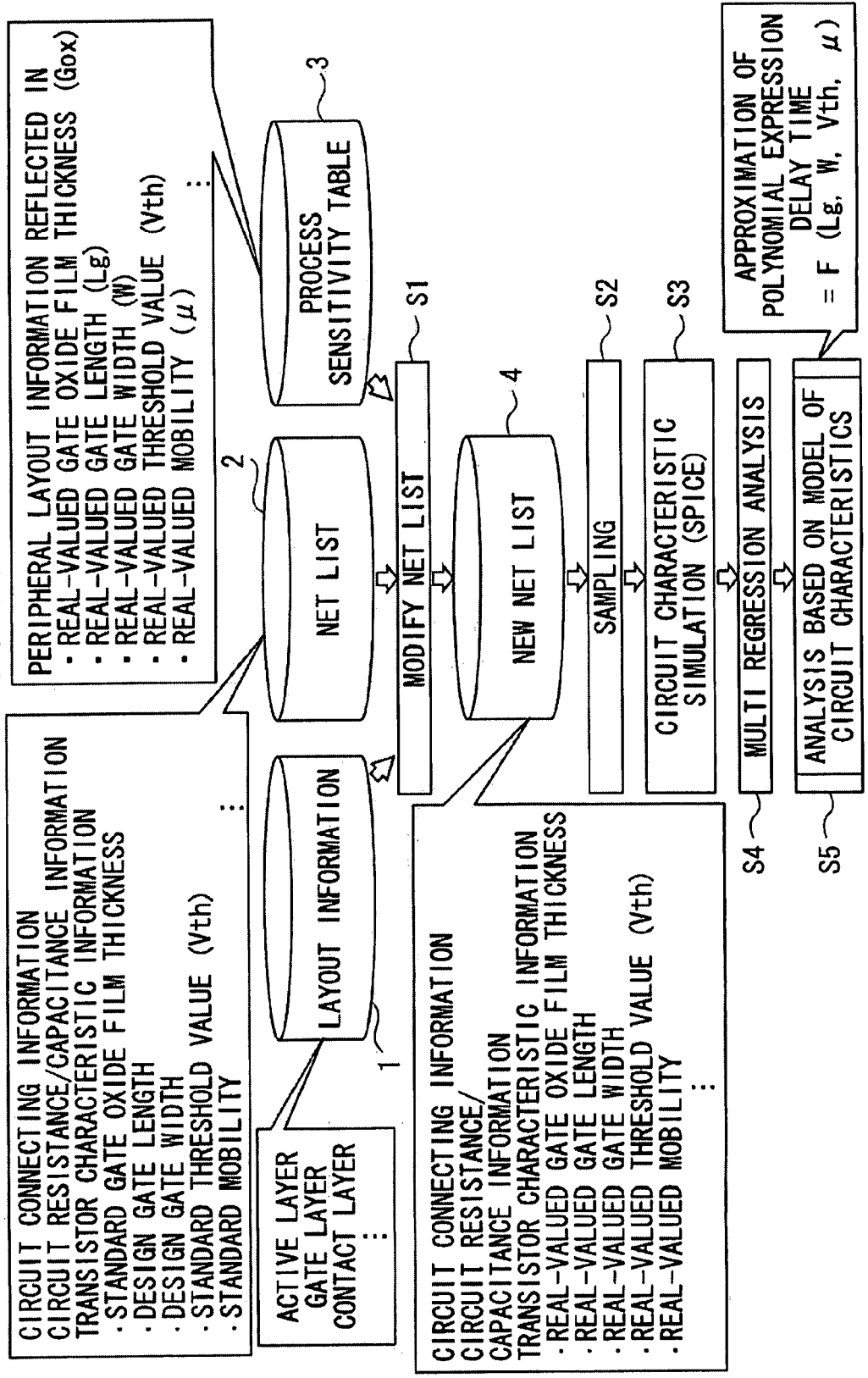
FIG. 1 is a diagram of a data flow of a design support tool in one embodiment.

FIG. 1 is diagram of a data flow in the design support tool. As shown in FIG. 1, the design support tool executes, at first, a net list modifying process. In the net list modifying process, the design support tool generates a new net list by inputting layout information 1, a net list 2 and a process sensitivity table 3 (S1). The process in S1 corresponds to "converting into a real-valued physical quantity".

Herein, the layout information 1 has information of pattern shapes that define individual devices such as an active layer, a gate layer and a contact layer. The net list 2 has mainly circuit connecting information for connecting the device to the device. Further, the net list 2 has wiring resistance information, capacitance information and transistor characteristic information.

The transistor characteristic information contains, e.g., a standard gate oxide film thickness, a design gate length, a design gate width, a standard threshold voltage (Vth) and standard mobility (which will hereinafter be simply referred to as standard values and correspond to basic physical quantities). Herein, the standard values connote design values used in standards in a design target technology, i.e., at an integration level.

The process sensitivity table 3 contains a rule of conversion into real values (corresponding to real-valued physical quantities), to be specific, into a real-valued gate oxide film thickness (Gox), a real-valued gate length (Lg), a real-valued gate width (W), a real-valued threshold voltage (Vth) and real-valued mobility ($\mu$) from the standard values corresponding to the device layout information related to each device (which will be hereinafter simply called as "peripheral layout information"). Herein, the real values connote dimensions of the circuit to be actually formed when generating the circuit on the semiconductor substrate according to the design pattern based on the standard values, and represent empirical values, experimental values or simulation values.

A reason why the real values deviate from the standard values is that the dimensions fluctuate due to, e.g., characteristics of the semiconductor manufacturing process. The characteristics of the semiconductor manufacturing process represent characteristics occurred when performing an exposure, development, etching, film formation, diffusion, oxidation, etc. These fluctuations are, it is considered, attributed to, e.g., fluctuations in an optical proximity effect, a selection ratio, a degree of anisotropy, a progress of etching, etc, these fluctuations being caused by a pattern density or pattern dimensions.

FIG. 3 shows an example of the peripheral layout information used in the process sensitivity table. In FIG. 3, a Si active layer 11 and a gate 12, which form a source and a drain, are provided in a device area 10 isolated by a device isolation film (e.g., STI (Shallow Trench Isolation)). The gate length Lg is a dimension in a source-to-drain direction of the gate, and the gate width W is a dimension of the gate extending crosswise over the source/drain region.

The peripheral layout information involves using, e.g., a gate pitch, SB (source/drain width, i.e., a width of the source region or the drain region), SBOF (STI offset of the source/drain, i.e., an offset distance of the source region from the device isolation film area, or an offset distance of the drain region from the device isolation film area), and SBE (an STI offset length of the source/drain, i.e., a dimension of the offset area in a direction orthogonal to the offset direction). The gate pitch is an interval between the gates 12 and 12. The SB is a dimension from one gate 12 to an edge of the source or the drain. The SBOF is a width of a gap formed between the gate 12 and the Si active layer 11, and the SBE is a length of this gap.

FIG. 4 shows an example of the process sensitivity table. The process sensitivity table contains the peripheral layout information, and an associative relationship between the standard/real values and the peripheral layout information. Namely, each row (record) in the process sensitivity table defines the associative relationship between the values of the gate pitch, the SB, the SBOF, the SBE and the values of the standard gate oxide film thickness/real-valued gate oxide film thickness (Gox), the design gate length/real-valued gate length (Lg), the design gate width/real-valued gate width (W), the standard threshold voltage/real-valued threshold voltage (Vth), the standard mobility/real-valued mobility ($\mu$).

A new net list 4 generated in a net list modifying process is registered with a multiplicity of combinations of the real values. A sampling process is that the design support tool selects a predetermined number of combinations of the real values (S2).

Then, in a circuit characteristic simulation process, the design support tool implements the SPICE-based simulation (S3). As a result, a circuit simulation is implemented about the net list containing the real-valued gate oxide film thickness (Gox), the real-valued gate length (Lg), the real-valued gate width (W), the real-valued threshold voltage (Vth) and the real-valued mobility ($\mu$), thereby obtaining the circuit characteristics. Herein, the circuit characteristics are, for example, the delay time, the power consumption, etc of the circuit. Note that the SPICE-based simulation itself is well known, and hence its description is omitted.

Next, the design support tool executes the multi regression analysis (S4). The multi regression analysis acquires the polynomial expression, wherein, for example, the variables are the real-valued gate oxide film thickness (Gox), the real-valued gate length (Lg), the real-valued gate width (W), the real-valued threshold voltage (Vth) and the real-valued mobility ($\mu$) etc., and function values are the delay time, standby power consumption, total power consumption and a leak current of the circuit etc. Step S4 corresponds to a polynomial expression setting step.

The multi regression analysis is an analyzing method of getting the values of the polynomial expression fitted to the characteristic values to be obtained in a way that determines coefficients of the terms of the variables, wherein a plurality of fluctuation quantities is set as the variables. The term in the polynomial expression is generally equivalent to or higher than "linear", and may contain a product of plural variables. Normally, the coefficient is determined to minimize errors of target characteristic value and the value (function value) of the polynomial expression in a definition area of the predetermined variable. Note that a method of obtaining a formula predicting one response variable with one independent variable, is called a single regression analysis, which can be attained by a least-square method. As broadly known, the least-square method determines the coefficient of the formula so as to minimize a sum of squares of an error of the response variable from a real-measured value. The multi regression analysis is what is extended to a plurality of variables.

Accordingly, it follows that a relationship between the variables and the characteristic values fitted to the result of the circuit characteristic simulation is acquired by the multi regression analysis. For example, the 2-input AND circuit in FIG. 6A is actualized by a layout in FIG. 6C. The standard gate oxide film thickness, the design gate length, the design gate width, the standard threshold voltage and the standard mobility, which correspond to this layout, are converted into the real-valued gate oxide film thickness (Gox), the real-valued gate length (Lg), the real-valued gate width (W), the real-valued threshold voltage (Vth) and the real-valued mobility ($\mu$) according to the process sensitivity table, thereby determining the polynomial expression with these values serving as the variables.

In this case, the characteristics used in the multi regression analysis are those about a finite number of combinations of the values that have been sampled in the sampling process in S2. If there is no deviation in the sampling according to the Design Of Experiments (DOE), it is possible to obtain the polynomial expression fitted to the characteristic values in which the new net list 4 (all of the combinations of the real values) containing non-sampling combinations is reflected.

Next, the design support tool executes the analysis by use of the polynomial expression (S5). Herein, desired combinations of variable values and the characteristic values for these combinations are obtained by substituting the real variable values into the polynomial expression acquired by the multi regression analysis. Then, the combinations of the variable values, in which the characteristic values conform to a predetermined standard, are obtained. Finally, a design target layout is to be selected by obtaining the combinations of the design values, which correspond to the combinations of the variable values.

Figure 2:
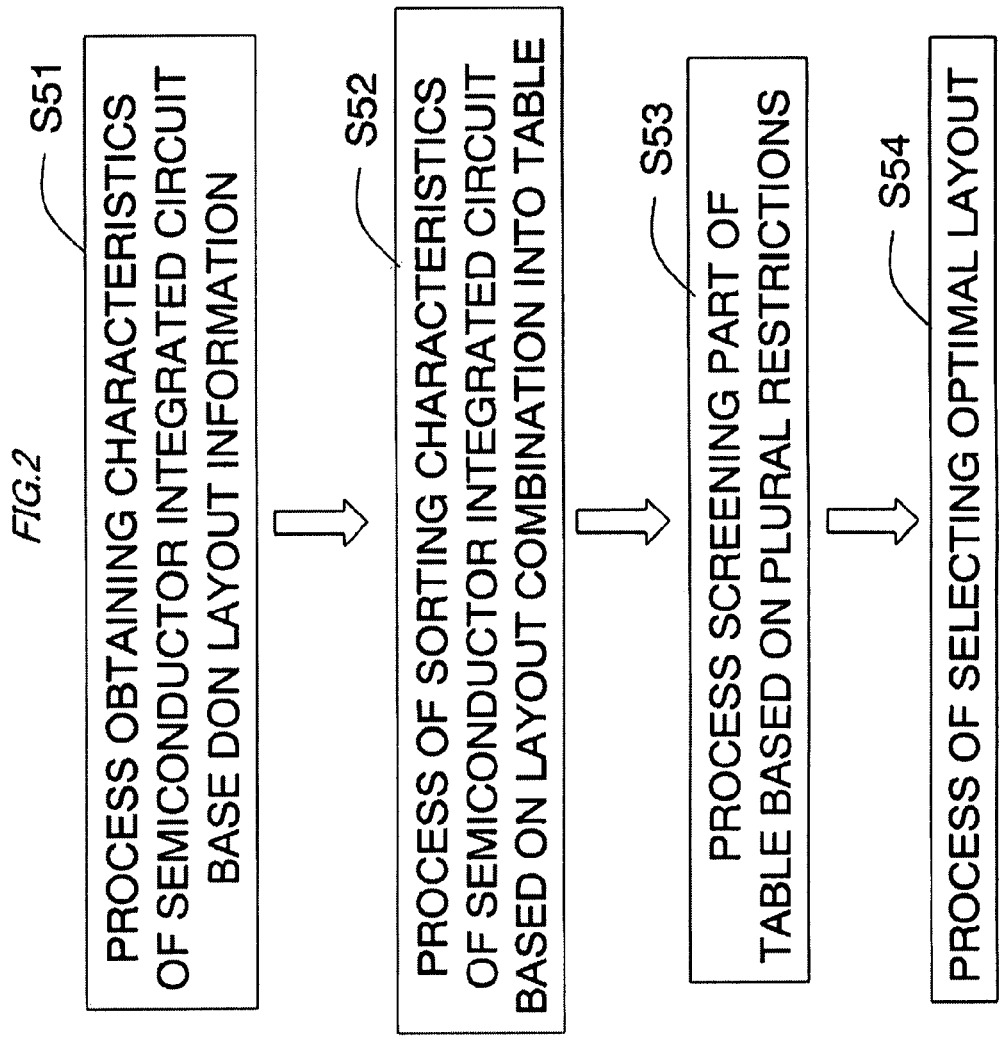
FIG. 2 is a flowchart showing a process of obtaining characteristics of a semiconductor integrated circuit on the basis of layout information by a polynomial expression.

FIG. 2 shows details of the process (S5 in FIG. 1) of obtaining the characteristics of the semiconductor integrated circuit based on the layout information by the polynomial expression. Herein, the design support tool sets the combinations of the variable values converted from the standard values (and the design values) of the layout information according to the process sensitivity table, and obtains the values (characteristic values) of the polynomial expression (S51). Step S51 corresponds to a step of calculating the characteristic values.

Then, the combinations of the thus-obtained variable values and characteristic values are sorted into a table (S52). FIG. 5 illustrates an example of the thus-acquired table. Herein, for instance, circuit delay time and power consumption defined as the characteristic values with respect to the combinations of the real-valued gate lengths and the real-valued gate widths of a plurality of transistors building up the 2-input AND circuit in FIGS. 6A and 6B, are obtained.

Then, part of the table is screened based on the predetermined restrictions (S53). Specifically, only the characteristic values fulfilling the restrictions are selected, and the variable values corresponding to these characteristic values are retained. Step S53 corresponds to a selecting step.

The design support tool refers to the pre-conversion design values corresponding to the variable values obtained, and presents the combinations of the design values or the layout information corresponding to these combinations of the design values to a user. This step corresponds to a step of obtaining transistor characteristic information or layout information corresponding to the selected characteristic values. The user, to whom the layout corresponding to the screened combinations of the variables is presented, can proceed with the design.

Further, the design support tool generates a layout of the semiconductor circuit in which to reflect the gate length, the gate width, the threshold voltage and the mobility obtained from the result of such a design, generates a photo mask, and determines manufacturing parameters in the manufacturing processes of the semiconductor circuit. Then, the semiconductor circuit is manufactured based on the manufacturing parameters through the manufacturing processes such as exposing, developing, etching, implanting impurities, performing a thermal treatment, forming an oxide film, forming a metal film, planarizing and forming a protective film.

Figure 7:
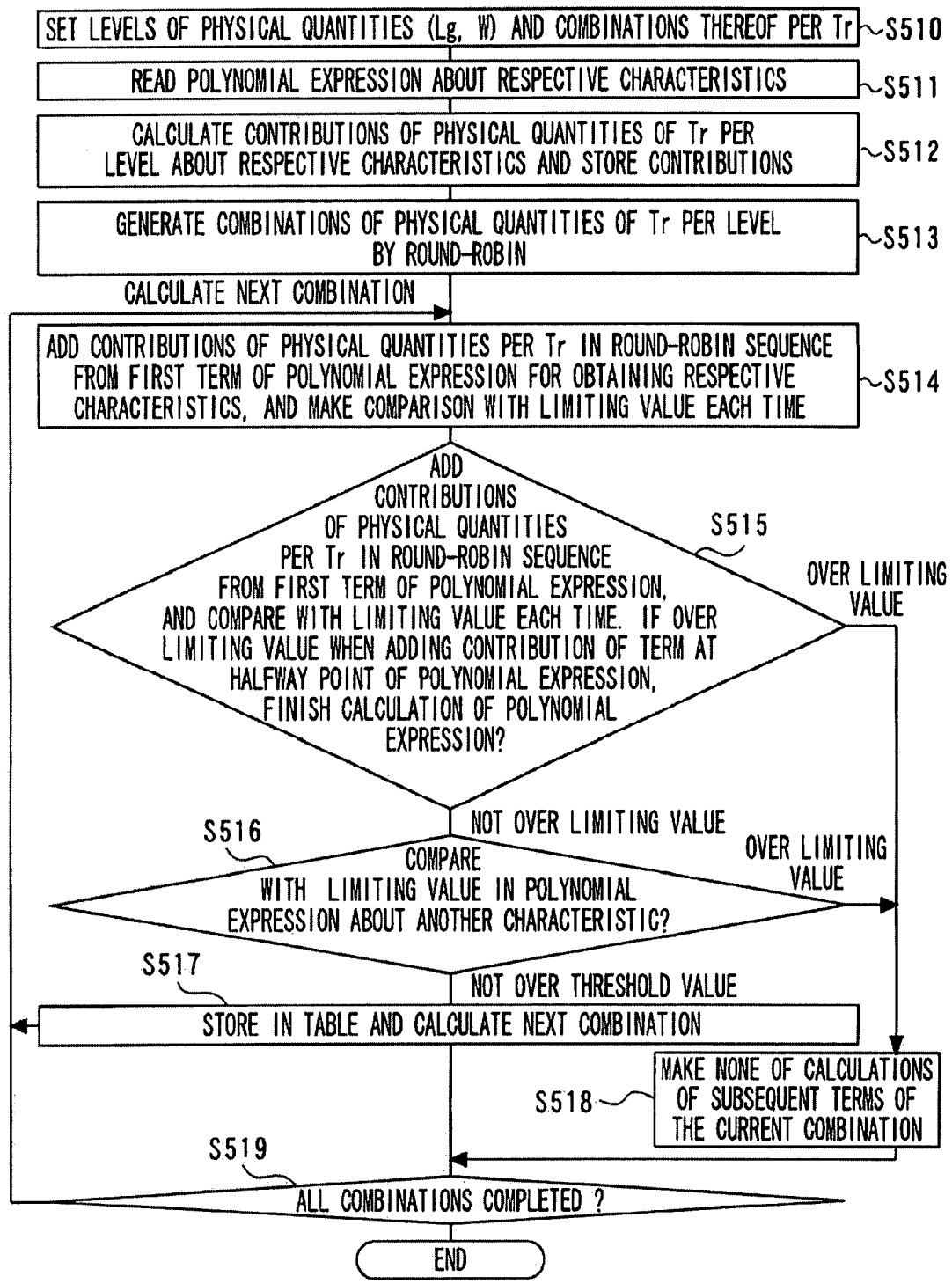
FIG. 7 is a flowchart showing details of the process of obtaining the characteristics of the semiconductor integrated circuit on the basis of layout information by the polynomial expression.

FIG. 7 shows details of a process (S51 in FIG. 2) of obtaining the characteristics of the semiconductor circuit based on the layout information by the polynomial expression. Herein, the description is made in a way that exemplifies the gate length Lg and the gate width W of each transistor as the physical quantities to be substituted into the values of the variables in the polynomial expression. The design support tool uses the gate length Lg, the gate width W, etc of every transistor as the variables, and sets combinations of these values at a plurality of levels. Next, the design support tool reads the definitions in the polynomial expression about the respective characteristics from the memory (S511) Herein, the "respective characteristics" connote, e.g., the standby power consumption, the total power consumption, the leak current or the delay time. Further, the "definitions in the polynomial expression" connote a degree of the variable and a coefficient of the variable that are included in the polynomial expression.

Then, the design support tool calculates contributions of the gate length Lg and the gate width W of each transistor with respect to the characteristics per level, and stores the calculated contributions in the memory (S512).

Thus, the round-robin combinations of the contributions of the gate length Lg and the gate width W per level are generated (S513).

Next, the following process is executed with respect to all of the combinations of the gate length Lg and the gate width W (S514). Namely, the contributions of the gate length Lg and the gate width W of every transistor, which correspond to the respective terms starting from the first term of the polynomial expression for obtaining the individual characteristics, are added.

Then, the characteristic represented by the value in the polynomial expression that is defined as the added result, is compared with the limiting value (S515). This process has no necessity of adding all of the terms in the polynomial expression. For example, in the polynomial expression organized by the first term through the N–th term, if it proves that the limiting value is not satisfied (if exceeding an upper limit value) at a point of time when adding the k–th ($1 =< k =< N$), the calculations from this point onward come to an end. Step S515 corresponds to a determining step. Thus, if the characteristic does not fulfill the limiting value, the combination thereof is discarded (S518).

On the other hand, if the characteristic fulfills the limiting value, the calculation of the polynomial expression for the next characteristic is made, and this characteristic is compared with the limiting value (S516). Through the same repetition, if any one of the characteristics does not fulfill the limiting value, the combination of the gate length Lg and the gate width W is discarded (S518). Whereas if all of the characteristics fulfill the limiting value, the combination of the gate length Lg and the gate width W is stored in the table, and the control proceeds to the process for a next combination of the gate length Lg and the gate width W (S517).

As described above, the design support tool according to the present embodiment obtains the real-valued gate length and the real-valued gate width on the basis of the process sensitivity table from the layout information generated when designed. Furthermore, the design support tool obtains the polynomial expression representing the characteristics fitted to the predetermined number of sampled combinations of the values from the real-valued gate lengths and the real-valued gate widths. Then, once the polynomial expression is obtained, the design support tool calculates the characteristics about all of the combinations at the respective levels, and selects only the combinations of the variable values that meet the desired characteristics. Accordingly, the number of combinations of the variable values is reduced by sampling, thereby saving a computation effort for the multi regression analysis. In this case, if there is no deviation in sampling, it is possible to obtain the polynomial expression fitted to the characteristics of almost all of the combinations at the respective levels. Then, the combinations of the variable values conforming to the desired characteristics can be selected by employing the polynomial expression. It is also feasible to acquire the layout information containing the design values corresponding to the variable values and to present the layout of the semiconductor integrated circuit, which conforms to the desired characteristics, to the user.

It is to be noted that the real-valued gate length and the real-valued gate width have been explained as the variables in the discussion made so far, however, the processing procedure is the same as above also in a case where the variables of the polynomial expression include other items of physical quantities.

FIRST MODIFIED EXAMPLE

In the embodiment, the values of the terms in the polynomial expression are sequentially calculated, the contributions are added, and it is determined whether the circuit characteristics meet the limiting values or not. In such a process, among the combinations of the physical quantities (the combinations of the gate lengths Lg, the gate widths W, etc), which should be substituted into the variables of the polynomial expression, the combinations contrary to the design rule may previously be excluded.

Moreover, after calculating the contributions of the respective terms in the polynomial expression (e.g., after adding the contributions of the first term through the k–th term halfway in the polynomial expression ending with the N–th term), as to the contributions from the next term onward (the contributions of the (k+1)th term through the N–th term), the maximum value and the minimum value thereof are previously stored, and it may be determined based on the contribution of the maximum value or the minimum value whether the characteristic satisfies the limiting value or not.

Considered is, for example, a case where a limiting condition is that the power consumption, which should be obtained, is equal to or smaller than a limiting value MAX0. In this case, when obtaining the contributions of the first term through the k–th term, as to the contributions of the (k+1)th term through the N–th term, the minimum value thereof may be added. Then, it may be determined whether or not a value obtained by (the contributions of the first term through the k–th term)+ (the minimum value of the contributions of the (k+1)th term through the N–th term) is within the limiting value.

As to such a minimum value, on the occasion of obtaining the contributions of the respective terms based on the variable values at the individual levels, a value minimizing the contribution may also obtained simultaneously.

Such a procedure being adopted, if the minimum value of the contributions of the (k+1)th term through the N–th term is once acquired, it can be determined from the respective terms (the k–th term where k is anyone of 1 through N,) in the middle of performing the calculations of the polynomial expression whether the characteristic values based on the combinations meet the limiting values or not. It is therefore possible to know, in the case of calculating all of the combinations of the gate lengths Lg and the gate widths W, that there is no necessity anymore for calculating all of the contributions in the middle of these calculations, and to reduce the calculation time.

Note that conversely in the case of determining whether in excess of a limiting value MIN0 or not, the maximum value of the contributions of the (k+1)th term trough the N–th term may be obtained for each k–th term. As to such a maximum value, on the occasion of obtaining the contributions of the respective terms based on the variable values at the individual levels, a value maximizing the contribution may also obtained simultaneously.

Figure 8:
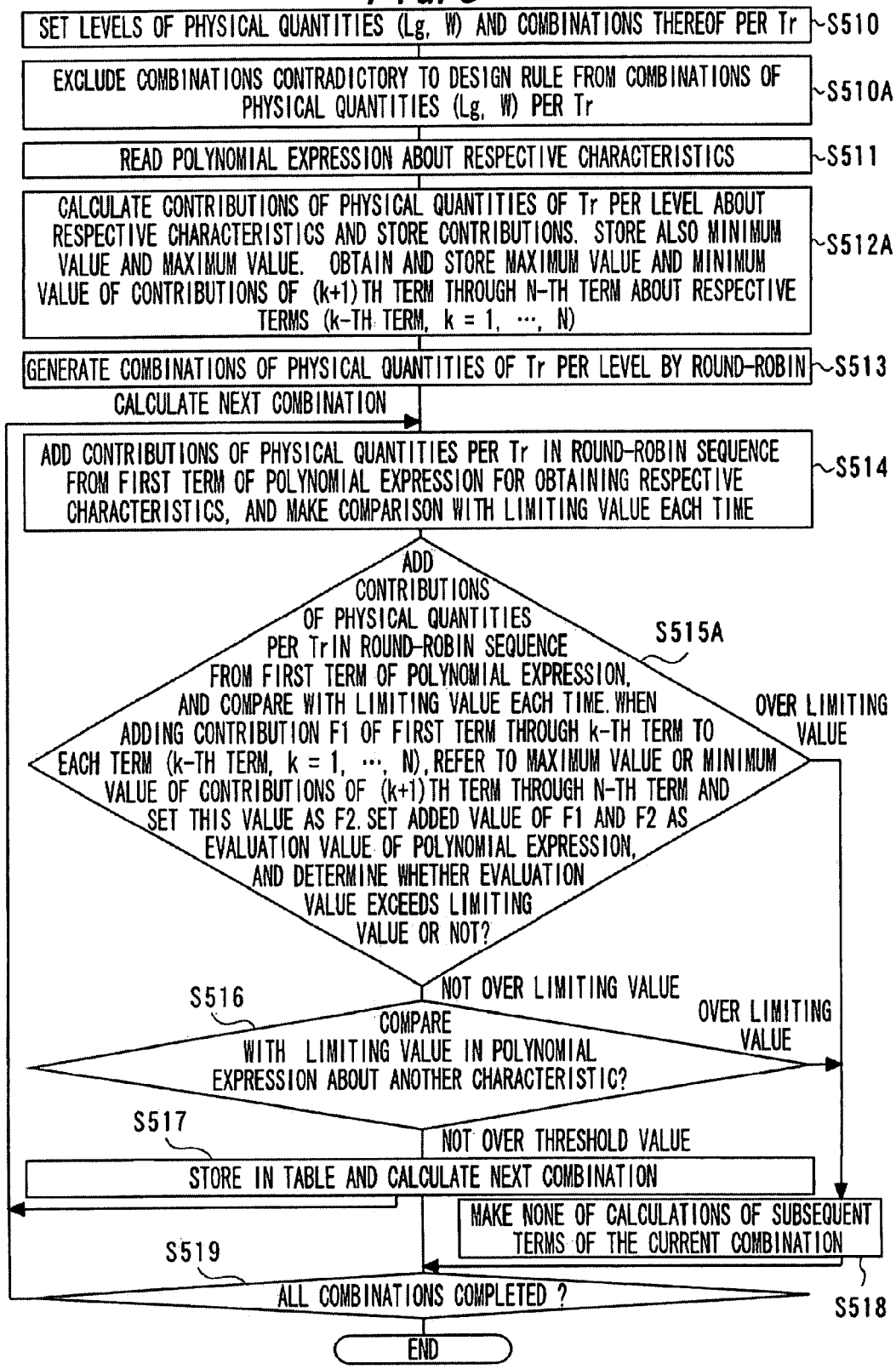
FIG. 8 is a flowchart showing details (modified example) of the process of obtaining the characteristics of the semiconductor integrated circuit on the basis of layout information by the polynomial expression.

FIG. 8 shows a modified example of the process of acquiring the characteristics of the semiconductor integrated circuit incorporating the processes described above. In this acquiring process, the processes other than in S510A, S512A and S515A are the same as those in FIG. 7, and hence their explanations are omitted.

The process in FIG. 8 is that the design support tool, after a process in S510 (alternatively, along the process in S510), excludes combinations contrary to the design rule from the combinations of the physical quantities (the gate length Lg, the gate width W, etc) of each transistor (S510A). The design rule is stored in a database managed by a design rule check function (DRC function) of the CAD system.

The design rule is described as a limiting value to, e.g., the gate width, a gate-to-gate space, or a gate-to-contact space. Accordingly, in the case of having obtained the combinations of the gate lengths Lg and the gate widths W of the circuit including the plurality of transistors, in these combinations, the combination of which the gate width W does not meet the design rule can be immediately distinguished. Further, the gate-to-gate space can be calculated from the gate length Lg and the gate width W of each transistor. Moreover, the gate-to-contact space can be calculated by setting the gate length Lg and the gate width W in the layout information. Thus, it is feasible to exclude the combination of the gate length Lg and the gate width W, wherein the gate width, the gate-to-gate space or the gate-to-contact space does not meet the design rule. This type of design rule check may adopt using a rule of checking whether, e.g., a device area, a chip area, etc meet predetermined reference values or not.

Further, the design support tool, in the process in S512A, when calculating the contributions of the gate length Lg and the gate width W of each transistor per level, obtains both of the maximum value and the minimum value of the contributions of the transistor, which will be calculated posterior to this previous transistor. Namely, the design support tool obtains and retains, when calculating the contribution of the k–th term (k=1, . . . , N), the maximum value and the minimum value of the contributions of the (k+1)th term through the N–th term.

Then, in the determination in S515A, when converting contributions F1 of the first term through the k–th term, the maximum value or the minimum value of the contributions of the (k+1)th term through the N–th term is set as F2, and the polynomial expression is evaluated from "F1+F2". Such a procedure enables the computation effort for the calculations of the polynomial expression to be reduced to a great degree. As a result, the design support tool is capable of efficiently performing the calculations of the polynomial expression for the whole circuit including the multiplicity of transistors, and capable of designing the circuit so that the delay time and the power consumption of the whole circuit fall within the range set by the predetermined limiting values. Step S515A corresponds also to the determining step. Step S515A corresponds, further, to a step of finishing the calculations of the polynomial expression.

Figure 9:
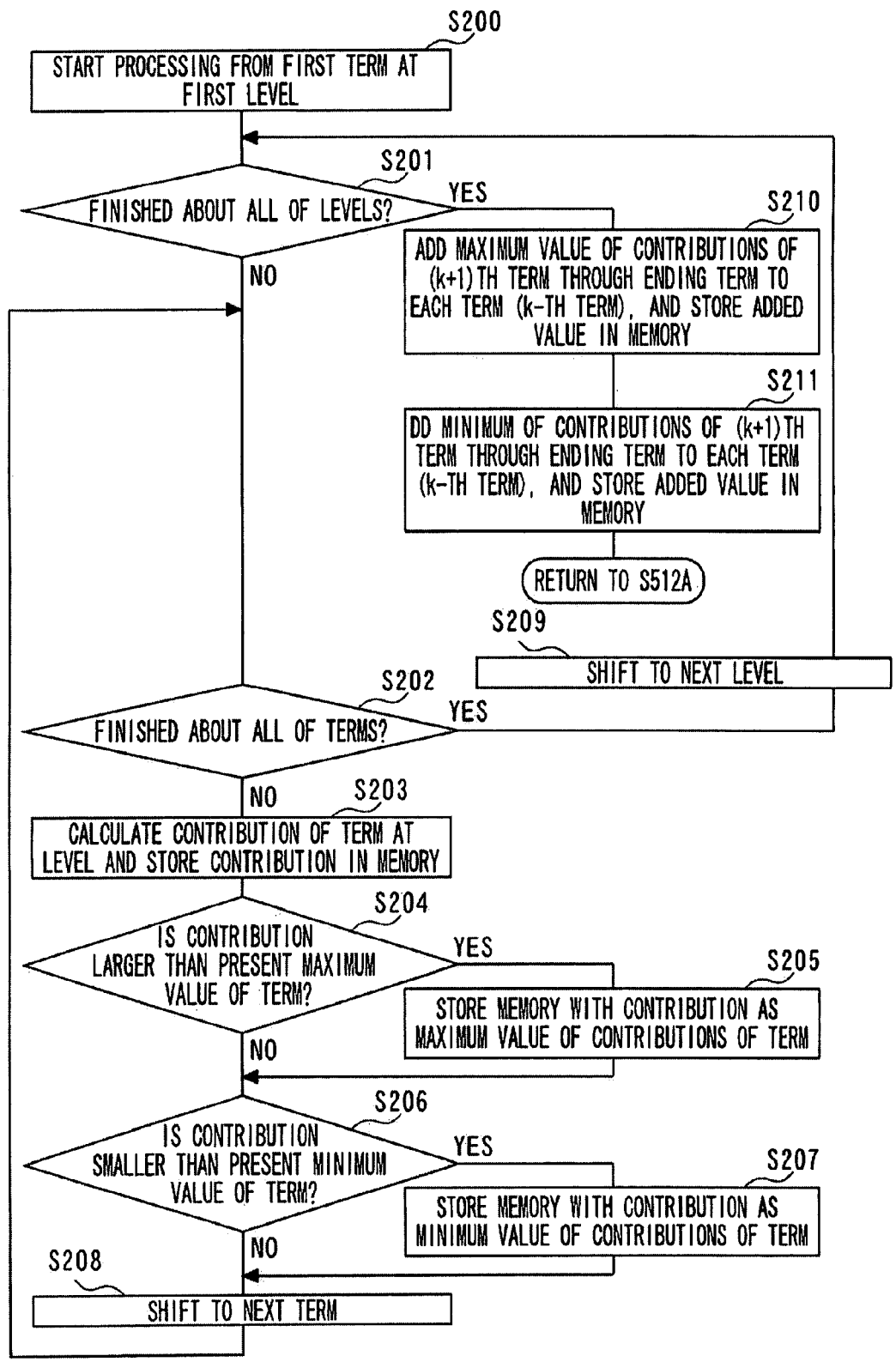
FIG. 9 is a processing flow of obtaining contributions to respective terms at individual levels, maximum/minimum values thereof, and total maximum/minimum values of the contributions from the term next to each of the terms up to an ending term.

FIG. 9 shows details of the process (S512A in FIG. 8) of obtaining the contributions of the respective terms at the individual levels, the maximum value and the minimum value of these contributions, and also the maximum value and the minimum value of a total of the contributions of the term next to each term through the ending term. In this process, the respective contributions in the polynomial expression are sequentially calculated with respect to the combinations of the variable values at the plurality of levels.

In this process, the design support tool starts the process from the first term at the first level (S200). Then, the design support tool determines whether the calculations at all of the levels are finished or not (S201). If not finished at all of the levels, the design support tool determines whether the calculations of all of the terms at the level concerned are finished or not (S202).

If the calculations of all of the terms are not yet finished, the design support tool calculates the contribution of the term concerned at the level concerned, and stores the calculated contribution in the memory (S203).

Next, the design support tool determines whether this contribution is larger than the present maximum value of the term concerned (S204). If the contribution is larger than the present maximum value, the design support tool stores this contribution as the maximum value of the term in the memory (S205).

Subsequently, the design support tool determines whether or not the contribution is smaller than the present minimum value of the term (S206). If the contribution is smaller than the present minimum value, the design support tool stores this contribution as the minimum value of the term in the memory (S207).

Then, the design support tool advances the calculation target to the next term (S208). Subsequently, the design support tool returns the control to S202. In S202, the design support tool, when deciding that the calculations of all of the terms have been finished, advances the calculation target to the next level (the combination of the variable values) (S209). Then, the design support tool returns the control to S201.

In S201, the design support tool, when deciding that the calculations at all of the levels have been finished, performs the following calculations based on the maximum value obtained in S205. To be specific, the design support tool adds the maximum value of the contributions of the terms (the (k+1)th term through the ending term) subsequent to the term (the k–th term) to each term (the k–th term), and stores the added value for every term (the k–th term) in the memory (S210).

Moreover, the design support tool performs the following calculations based on the minimum value obtained in S206. Specifically, the design support tool adds the minimum value of the contributions of the terms (the (k+1)th term through the ending term) subsequent to the term (the k–th term) to each term (the k–th term), and stores the added value for every term (the k–th term) in the memory (S211). Thereafter, the design support tool returns the control to S512A.

Through these processes, the added values of the maximum value and the minimum value of the contributions of the terms (the (k+1)th term through the ending term) subsequent to the term concerned, can be obtained on the same order of calculation amounts as the calculation amounts for calculating the contributions of the respective terms. Step S210 and step S211 correspond to a retaining step.

As described above, the design support tool can, in the calculations of the polynomial expression approximated to the characteristics of the semiconductor integrated circuit, when finishing the calculations up to the k-th term (k=1, . . . , N), exclude the combinations of the variable values that do not meet the limiting values with taking the limited computation effort.

SECOND MODIFIED EXAMPLE

If the limiting values are strict, the combination of the physical quantities such as the gate length Lg, the gate width W, etc matching with the characteristics satisfying the limiting values, are not obtained. Whereas if the limiting values are not strict, it follows that the multiplicity of combinations are acquired. Such being the case, a desired number of combinations are designated, and the threshold may also be reset to obtain the combinations of the gate length Lg and the gate width W, of which the number is approximate to this desired number of combinations.

Figure 10:
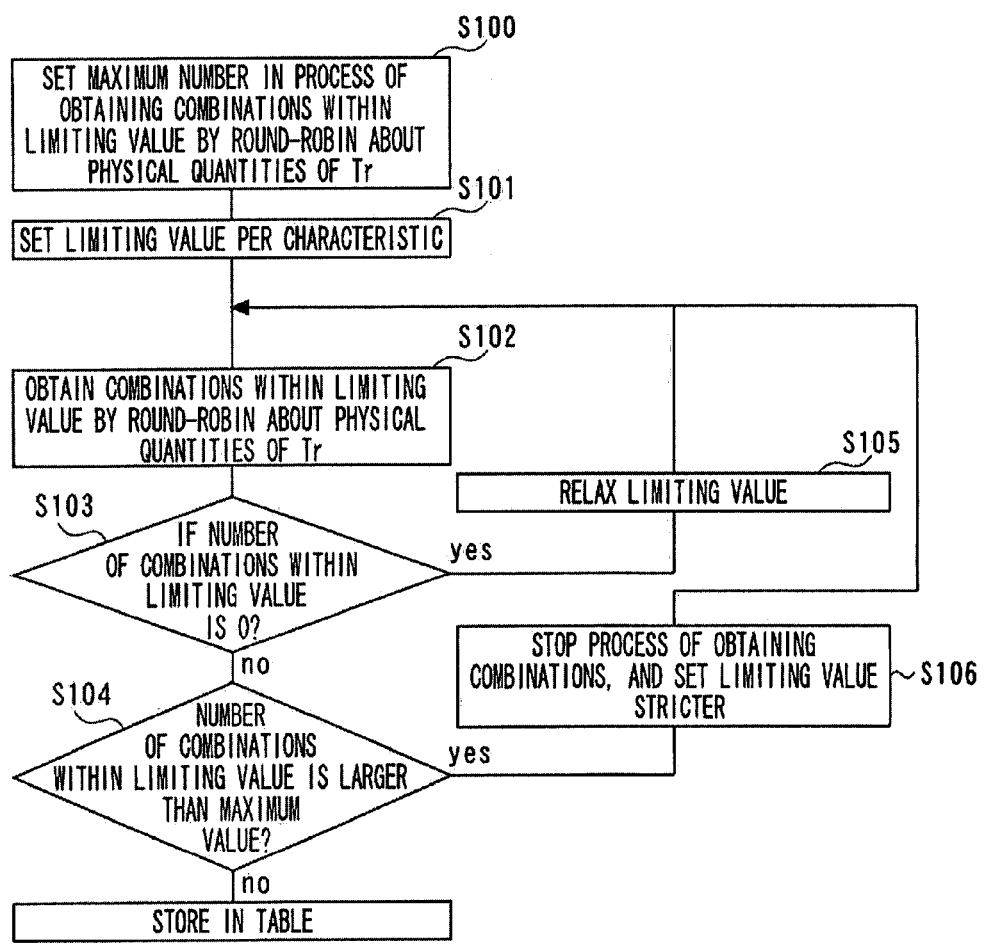
FIG. 10 is a flowchart showing a processing procedure of resetting a threshold value.

FIG. 10 shows a processing procedure of resetting the limiting value. In this process, the design support tool sets the maximum number of combinations when obtaining the combinations falling within the limiting values by the round-robin of the variable values (the gate length Lg, the gate width W, etc) of each transistor (S100). This setting may also be, for example, done in such a way that the user predetermines and inputs default values.

Then, the design support tool sets the limiting value per characteristic (S101). Subsequently, the design support tool obtains the combinations that meet the limiting values based on the round-robin of the variable values of each transistor (S102).

Then, the design support tool determines whether the obtained number of combinations is "0" or not (S103). If the number of combinations is "0", the design support tool relaxes the limiting value by a predetermined value (S105). Subsequently, the design support tool returns the control again to the process in S101.

On the other hand, the design support tool determines whether or not the obtained number of combinations is larger than the predetermined number of combinations (S104). Then, if the obtained number of combinations is larger than the predetermined number of combinations, the design support tool changes the limiting value by a predetermined value in a getting-strict direction (S106). Subsequently, the design support tool returns the control again to the process in S101.

Thus, when the number of combinations is equal to or larger than "1" but equal to or smaller than the predetermined number, these combinations are stored in the table. Such a procedure enables the design support tool to obtain the desired number of combinations of the variable values and to present the same number of types of layouts to the user.

THIRD MODIFIED EXAMPLE

In the embodiment, the circuit characteristics about the combinations of the gate length Lg and the gate width W are obtained. In place of these characteristics, variation characteristics (corresponding to variation characteristics) of the circuit characteristics may also by acquired by the polynomial expression. Herein, the "variation characteristics of the circuit characteristics" connote, e.g., a variation in the power consumption, a variation in the leak current, or a variation of the circuit delay time, etc of the circuit.

Namely, a polynomial expression taking account of a process variation occurred in the manufacturing process may also be obtained previously based on the layout information such as a device isolation pattern variation and a pitch to a neighboring gate in addition to the physical quantities of the gate length, the gate width, etc of the transistor. To be specific, there may be set the polynomial expression, wherein the independent variables include, in addition to the gate length Lg, the gate width W, the threshold voltage Vth, the mobility $\mu$, etc, variation quantities epsLg, epsW, epsVth, eps$\mu$, etc thereof, and the response variables are the variation characteristics of the circuit characteristics.

Generated, then, is a table that sorts the real-valued gate length, a variation in the real-valued gate length, the real-valued gate width, a variation in the real-valued gate width, the real-valued threshold voltage (Vth) of the transistor, a variation in the real-valued threshold voltage, the mobility (μ) and a variation in the mobility. Subsequently, the real-valued gate length, the variation in the real-valued gate length, the real-valued gate width, the variation in the real-valued gate width, the real-valued threshold voltage of the transistor, the variation in the real-valued threshold voltage and the real-valued mobility (μ) of the transistor are extracted based on the peripheral layout information of each of the transistors in a certain circuit.

The circuit simulation is implemented by use of these items of information, thereby calculating the circuit characteristics. A plurality of circuits having the combinations of the real-valued gate length and the real-valued gate width of each transistor, the real threshold value of the transistor and the real-valued mobility (μ) of the transistor, which are deviated from the central values (e.g., the standard values when designed), is generated while taking the variations into consideration, and similarly the circuit characteristics such as the circuit delay time and the power consumption are calculated.

At this time, a frequency (a frequency of occurrence of the delay time), at which these circuit characteristics occur due to the manufacturing variations, is determined by a degree of the variation of each variable (which is, e.g., a half-value width from the central value of the distribution) and by a deviation quantity from the central value. Therefore, from the result of implementing the simulations of the plurality of circuits sampled based on the Design Of Experiments, the multi regression analysis is conducted, wherein the variables are the real-valued gate length, the variation in the real-valued gate length, the real-valued gate width, the variation in the real-valued gate width, the real-valued threshold voltage of the transistor, the variation in the real-valued threshold voltage, the real-valued mobility (μ) and the variation in the real-valued mobility, and the response variable (variate) is the variation characteristic of the circuit delay time. The variation characteristic of the delay time of the target circuit can be thereby approximated by the polynomial expression, wherein the variables are the real-valued gate length, the variation in the real-valued gate length, the real-valued gate width and the variation in the real-valued gate width, the real threshold value of the transistor and the variation in the real threshold value, the real-valued mobility (μ) of the transistor and the variation in the real-valued mobility.

The process of sorting the characteristics of the semiconductor integrated circuit into the table calculates, in the same way as in the embodiment, the combinations of the variable values such as the real-valued widths of all of the transistors at the plurality of levels by use of the approximation formula of the polynomial expression, and sorts the calculated combinations of variable values into the table.

The process of screening part of the table on the basis of the plurality of restrictions screens the variation characteristics of the circuit delay time in the case of calculating the combinations of the real-valued gate widths of all of the transistors at the plurality of levels by setting, e.g., the design rule or the maximum design gate width. Alternatively, the screening is performed with the delay time and the power consumption being used as the reference indexes, and an optimum layout can be selected from the combinations of the remaining layouts.

FOURTH MODIFIED EXAMPLE (1) An optimum value may be calculated, wherein a difference value from the reference value is set as the variable.

The setting procedure based on the multi regression analysis in this case is the same as above. A difference from the above-mentioned is, however, such a point that the variables are the difference values from all of the reference values.

(2) In the case of changing the standard value depending on the difference value, if the change target is a mask pattern, a value converted by MEEF (Mask Error Enhancement Factor) may be set as the difference value. For instance, if a change quantity on the mask is a, a change quantity on the substrate becomes a x MEEF. Conversely, if the change quantity on the substrate is b, the change quantity on the mask becomes b/MEEF. The MEEF is normally determined as an experimental value or a simulation value.

The physical quantities used by the design support tool for the calculation of the polynomial expression are expressed as, e.g., the optimum real-valued gate length and the optimum real-valued gate width actualized by the ideal manufacturing process with no manufacturing error. In the normal semiconductor process, however, when the pattern on the semiconductor substrate is generated from the pattern on the mask, an error on the mask is multiplied by a predetermined ratio and thus occurs on the semiconductor substrate. Therefore, the MEEF conversion may be applied to the difference between the original real-valued gate length (or the original real-valued gate width) converted based on the peripheral layout information of each of the transistors of the circuit and the design gate length (or the design gate width). This conversion enables a further accurate layout to be provided.

Moreover, the peripheral layout is changed by changing the design gate length or the design gate width. Based on the thus-changed layout information, the accuracy of the approximation by the polynomial expression can be improved by repeating again the process (1) of obtaining the characteristics of the semiconductor integrated circuit by the polynomial expression, the process (2) of sorting the semiconductor integrated circuit characteristics based on the combination of the layouts into the table, the process (3) of screening part of the table based on the plurality of restrictions, and the process (4) of presenting the layout selected from the remaining layouts.

FIFTH MODIFIED EXAMPLE

In the embodiment, the circuit characteristics about the combinations of the gate length Lg and the gate width W are obtained by the polynomial expression. Further, the variation characteristics of the circuit characteristics are obtained by the polynomial expression. The embodiment is limited to neither the circuit characteristics nor the variation characteristics of the circuit characteristics. Namely, the present invention can be applied to the analysis of an arbitrary phenomenon having the relationships between the plural types of fluctuation quantities (independent variables) and response variables. For example, the analysis may also be conducted by applying the procedures exemplified in the present embodiment about the fluctuations of the process parameters in the semiconductor manufacturing process. For instance, the independent variables may be a gas ratio, a temperature, an atmospheric pressure defined as condition parameters in the etching, the thermal treatment, the oxidation, the exposure and the development with respect to the semiconductor substrate, and the response variables may be a pattern shape to be formed, a film thickness, etc, or variation characteristics thereof. Moreover, an etching speed, a selection ratio, etc, or variation characteristics thereof may also be set as the response variables.

<Storage Media Readable for Computers etc.>

A program that causes computers, other devices or machines, etc. (hereinafter referred to as computers etc.) to implement any of the functions described above may be stored in storage media readable by computers etc. Then, the computers etc. read the program from the storage media and execute the program to provide the functions.

The storage media readable for computers etc. include media that are capable of electrically, magnetically, optically, mechanically, or chemically storing information, such as data and programs, and that are readable from computers etc. Examples of such recording media that are detachable from computers etc. include flexible disks (registered trademark), magneto-optical disks, CD-ROMs, CD-R/Ws, DVDs, DATs, 8-mm tapes, memory cards, etc.

Examples of such storage media that are fixed in computers etc. include hard disks, ROMs (Read Only Memories), etc.

<Others>

The disclosures of Japanese patent application No. JP 2006-300507 filed on Nov. 6, 2006 including the specification, drawings and abstract are incorporated herein by reference.

What is claimed is:

1. A method of laying out a semiconductor circuit, comprising:
    obtaining at least one of transistor characteristic information and variations in the transistor characteristic information on the basis of layout information about regions formed with transistors;
    obtaining at least one of a polynomial expression representing a relationship between characteristic values of a circuit including the transistors and the transistor characteristic information, and a polynomial expression representing a relationship between variations of characteristic values of the circuit and variations in the transistor characteristic information;
    calculating, by using a computer, a plurality of characteristic values corresponding to plural sets of transistor characteristic information or a plurality of variations of characteristic values corresponding to plural sets of variations in the transistor characteristic information by using the polynomial expression;
    selecting part of the plurality of the characteristic values which are values of a function of the polynomial expression or part of the plurality of the variations of the characteristic values, the variations being values of a function of the polynomial expression, on the basis of a restriction about the characteristic values; and
    obtaining the transistor characteristic information or the layout information used as a value of the variable in the function, corresponding to the selected part of the plurality of the characteristic values being the values of the function or the selected part of the plurality of the variations being the values of the function.

2. The method of laying out a semiconductor circuit according to claim 1, wherein the characteristic value and the restriction use, as an index, at least one of circuit delay time, a leak current, standby power consumption and total power consumption.

3. The method of laying out a semiconductor circuit according to claim 1, wherein the restriction includes an index based on a design rule containing at least one of a gate width, a gate-to-gate pitch and a gate-to-contact space, or an index based on a circuit area.

4. The method of laying out a semiconductor circuit according to claim 1, wherein the transistor characteristic information is obtained by converting basic physical quantities defined as manufacturing target values of the circuit into real-valued physical quantities generated actually on the circuit.

5. The method of laying out a semiconductor circuit according to claim 4, wherein the polynomial expression setting step includes obtaining the polynomial expression on the basis of the transistor characteristic information containing the real-valued physical quantities.

6. The layout method of a semiconductor circuit according to claim 1, wherein difference values from standard values of the design target semiconductor circuit are set in the variables of the polynomial expression.

7. The method of laying out a semiconductor circuit according to claim 6, further converting the difference value by MEEF (Mask Error Enhancement Factor) equivalent to a ratio of an error between the pattern on the mask and a pattern formed on the semiconductor substrate in case of the layout information defining a pattern on a mask that is projected by light on a semiconductor substrate.

8. The method of laying out a semiconductor circuit according to claim 1, wherein the restriction contains a plurality of items corresponding to the plural types of characteristic values.

9. The method of laying out a semiconductor circuit according to claim 1, further comprising a determining step of quitting the calculation of the polynomial expression based on the combinations of the variable values when finishing calculations of contributions of the respective variable being processed sequentially from the head in a calculation order of the polynomial expression for every combination of the variable values, and when the characteristic value based on the contributions being calculated from the head variable in the calculation order up to the respective variable reaches a predetermined limiting value.

10. The method of laying out a semiconductor circuit according to claim 9, further calculating beforehand and retaining at least one of a minimum value and a maximum value of the characteristic values based on the contributions accumulated from each of the variables organizing the polynomial expression up to an ending variable in the calculation order of the polynomial expression with respect to every combination of the variable values,
    wherein the determining step includes executing the calculation by use of the maximum value or the minimum value about the contributions of the variables subsequent the variable of which the contribution to the polynomial expression should be calculated next to the respective variable when finishing the calculations of the characteristic values based on the contributions of the respective variables, and quitting the calculation of the polynomial expression based on the combination of the variable values when the characteristic value calculated by use of the maximum value or the minimum value reaches the predetermined limiting value.

11. The method of laying out a semiconductor circuit according to claim 1, further comprising:
    setting an upper limit value of the number of combinations of the variables corresponding to the characteristic values selected in the selecting step;
    strengthening a restricting degree based on the restriction if the number of combinations of the variables corresponding to the characteristic values selected in the selecting step exceeds the upper limit value; and
    relaxing the restricting degree based on the restriction if the number of combinations of the variables corresponding to the characteristic values selected in the selecting step is "0".

12. A non-transitory computer storage medium readable by a machine tangible embodying a program of instructions executable by the machine, comprising:
- obtaining at least one of transistor characteristic information and variations in the transistor characteristic information on the basis of layout information about regions formed with transistors;
- obtaining at least one of a polynomial expression representing a relationship between characteristic values of a circuit including the transistors and the transistor characteristic information, and a polynomial expression representing a relationship between variations of characteristic values of the circuit and variations in the transistor characteristic information;
- calculating a plurality of characteristic values corresponding to plural sets of transistor characteristic information or a plurality of variations of characteristic values corresponding to plural sets of variations in the transistor characteristic information by using the polynomial expression;
- selecting part of the plurality of the characteristic values which are values of a function of the polynomial expression or part of the plurality of the variations of the characteristic values, the variations being values of a function of the polynomial expression, on the basis of a restriction about the characteristic values; and
- obtaining the transistor characteristic information or the layout information used as a value of the variable in the function, corresponding to the selected part of the plurality of the characteristic values being the values of the function or the selected part of the plurality of the variations being the values of the function.

13. A method of manufacturing a semiconductor circuit, comprising:
- obtaining at least one of transistor characteristic information and the variations in the transistor characteristic information on the basis of layout information about regions formed with transistors;
- obtaining at least one of a polynomial expression representing a relationship between characteristic values of a circuit including the transistors and the transistor characteristic information, and a polynomial expression representing a relationship between variations of characteristic values of the circuit and variations in the transistor characteristic information;
- calculating, by using a computer, a plurality of characteristic values corresponding to plural sets of transistor characteristic information or a plurality of variations of characteristic values corresponding to plural sets of variations in the transistor characteristic information by using the polynomial expression;
- selecting part of the plurality of the characteristic values which are values of a function of the polynomial expression or part of the plurality of the variations of the characteristic values, the variations being values of a function of the polynomial expression, on the basis of a restriction about the characteristic values;
- obtaining the transistor characteristic information or the layout information used as a value of the variable in the function, corresponding to the selected part of the plurality of the characteristic values being the values of the function or the selected part of the plurality of the variations being the values of the function; and
- manufacturing the semiconductor circuit on the basis of the obtained transistor characteristic information or the obtained layout information.

14. The method of manufacturing a semiconductor circuit according to claim 13, wherein the step of selecting part of the plural characteristic values includes selecting the characteristic value that meets the restriction about the layout information or the transistor characteristic information.

15. The method of manufacturing a semiconductor circuit according to claim 13, wherein the characteristic value is power consumption, delay time or a leak current of the semiconductor circuit.

16. The method of manufacturing a semiconductor circuit according to claim 13, wherein the layout information contains at least one of a pattern shape, a planar shape of a device isolation region, a gate-to-gate pitch, a width of a source region, a width of a drain region, an shape of an offset region between the source region and the device isolation region, a dimension of the source offset region, a shape of a drain offset region between the drain region and the device isolation region and a dimension of the drain offset region, which define a device including at least one or more of an active layer, a gate layer and a contact layer.

17. The method of manufacturing a semiconductor circuit according to claim 13, wherein the transistor characteristic information contains a gate length, a variation in the gate length, a gate width, a variation in the gate width, a threshold voltage of the transistor and a mobility of carriers within the transistor.

18. The method of manufacturing a semiconductor circuit according to claims 13, further comprising a determining step of quitting the calculation of the polynomial expression based on the combinations of the variable values when finishing calculations of contributions of the respective variables sequentially from the head in a calculation order of the polynomial expression for every combination of the variable values and when the characteristic value based on the contributions from the head variable in the calculation order up to the respective variable reaches a predetermined limiting value.

19. The method of manufacturing a semiconductor circuit according to claim 18, further calculating beforehand and retaining at least one of a minimum value and a maximum value of the characteristic values based on the contributions accumulated from each of the variables organizing the polynomial expression up to an ending variable in the calculation order of the polynomial expression with respect to every combination of the variable values,
- wherein the determining step includes executing the calculation by use of the maximum value or the minimum value about the contributions of the variables subsequent the variable of which the contribution to the polynomial expression should be calculated next to the respective variable when finishing the calculations of the characteristic values based on the contributions of the respective variables, and quitting the calculation of the polynomial expression based on the combination of the variable values when the characteristic value calculated by use of the maximum value or the minimum value reaches the predetermined limiting value.

20. The method of manufacturing a semiconductor circuit according to claim 13, wherein the restriction includes a variation in the delay time of the circuit.

* * * * *